United States Patent
Konno et al.

(10) Patent No.: US 7,498,294 B2
(45) Date of Patent: Mar. 3, 2009

(54) CLEANING COMPOSITION, METHOD FOR CLEANING SEMICONDUCTOR SUBSTRATE, AND PROCESS FOR MANUFACTURING SEMICONDUCTOR DEVICE

(75) Inventors: Tomohisa Konno, Chuo-ku (JP); Kiyonobu Kubota, Chuo-ku (JP); Masayuki Hattori, Chuo-ku (JP); Nobuo Kawahashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 333 days.

(21) Appl. No.: 11/052,910

(22) Filed: Feb. 9, 2005

(65) Prior Publication Data

US 2005/0176606 A1  Aug. 11, 2005

(30) Foreign Application Priority Data

Feb. 10, 2004  (JP) .............................. 2004-033158

(51) Int. Cl.
*H01L 21/461* (2006.01)

(52) U.S. Cl. ....................................... 510/175; 438/692

(58) Field of Classification Search ................ 510/175; 438/692
See application file for complete search history.

(56) References Cited

U.S. PATENT DOCUMENTS

| | | | |
|---|---|---|---|
| 6,375,545 B1* | 4/2002 | Yano et al. .................... | 451/36 |
| 6,440,856 B1 | 8/2002 | Bessho et al. | |
| 6,777,335 B2* | 8/2004 | Hasegawa ................... | 438/691 |
| 2001/0049912 A1* | 12/2001 | Motonari et al. ............... | 51/307 |
| 2002/0173243 A1* | 11/2002 | Costas et al. .................. | 451/41 |
| 2003/0109413 A1 | 6/2003 | Geffroy et al. | |
| 2004/0082180 A1 | 4/2004 | Minamihaba et al. | |
| 2004/0132305 A1* | 7/2004 | Nishimoto et al. .......... | 438/690 |

FOREIGN PATENT DOCUMENTS

| | | |
|---|---|---|
| EP | 1 020 501 A2 | 7/2000 |
| JP | 10-72594 | 3/1998 |
| JP | 2004-146582 | 5/2004 |

OTHER PUBLICATIONS

Patent Abstracts of Japan, JP 11-222600, Aug. 17, 1999.
Werner Kern, et al., "Cleaning Solutions Based on Hydrogen Peroxide for use in Silicon Semiconductor Technology", RCA Review, vol. 31, No. 2, Jun. 1970, pp. 186-207.
W. Kern, "Hydrogen peroxide solutions for silicon wafer cleaning", RCA Engineer, vol. 28, No. 4, Jul./Aug. 1983, pp. 99-105.
"Semiconductor World", Supplied by the British Library-"The World's knowledge" www.bl.uk, vol. 16 part 1, No. 3, Oct. 28, 1997, p. 92.

* cited by examiner

*Primary Examiner*—Gregory E Webb
(74) *Attorney, Agent, or Firm*—Oblon, Spivak, McClelland, Maier & Neustadt, P.C.

(57) ABSTRACT

The cleaning composition which comprises organic polymer particles (A) having a crosslinked structure and a surfactant (B) and is used after chemical mechanical polishing. The cleaning method of a semiconductor substrate is a method for cleaning semiconductor substrate given after chemical mechanical polishing, by the use of the cleaning composition. The process for manufacturing a semiconductor device including a step of chemically and mechanically polishing a semiconductor substrate and a step of cleaning the semiconductor substrate obtained after the chemical mechanical polishing, by the cleaning method.

16 Claims, 1 Drawing Sheet

CLEANING COMPOSITION, METHOD FOR CLEANING SEMICONDUCTOR SUBSTRATE, AND PROCESS FOR MANUFACTURING SEMICONDUCTOR DEVICE

FIELD OF THE INVENTION

The present invention relates to a cleaning composition, a cleaning method and a process for manufacturing a semiconductor device. More particularly, the invention relates to a cleaning composition which is favorably applicable in a cleaning step after chemical mechanical polishing of a semiconductor substrate, particularly a semiconductor substrate having a metal wiring portion, a cleaning method using the cleaning composition and a process for manufacturing a semiconductor device including a step of cleaning a semiconductor substrate by the cleaning method after chemical mechanical polishing.

BACKGROUND OF THE INVENTION

As a planarization technology in manufacturing of semiconductor devices, a chemical mechanical polishing technology is employed. The chemical mechanical polishing is a technique wherein an object to be polished is brought into contact with a polishing pad under pressure and the object to be polished and the polishing pad are slid on each other with feeding a chemical mechanical polishing dispersion onto the polishing pad to chemically and mechanically polish the object to be polished. The chemical mechanical polishing dispersion used herein generally contains various chemicals such as an etching agent and a complexing agent in addition to abrasives. After the polishing, therefore, abrasives and polishing dust sometimes remain on the polished surface. In the case where a wiring comprising a metallic material is present on the polished surface, metal ions chemically abstracted from the polishing surface by the action of the chemicals contained in the chemical mechanical polishing dispersion are readsorbed on the polished surface, and hence, contamination of the polished surface sometimes takes place inevitably.

With extremely high integration of semiconductor devices in recent years, contamination by impurities has exerted great influences on the performance of the semiconductor devices and in its turn on the yield of the manufactured articles, even if the impurities are in trace amounts. On this account, more strict contamination control than before has been required.

One of such contamination controls is cleaning on a polished surface after the polishing operation, and methods for removing contamination of a polished surface using various cleaning agents have been proposed.

For example, in order to remove contamination of an insulating film after chemical mechanical polishing, a cleaning method using a cleaning agent containing hydrofluoric acid or ammonia has been proposed (see "Hydrogen Peroxide Solutions for Silicon Wafer Cleaning", RCA Engineer, 28(4), p. 9 (1983) and "Clean Solutions Based in Hydrogen Peroxide for Use in Silicon Semiconductor Technology", RCA Review, 31, p. 187 (1970)). The cleaning agent containing hydrofluoric acid, however, corrodes metallic materials, so that this agent cannot be applied to semiconductor substrates having a metal wiring portion. The cleaning agent containing ammonia also corrodes metallic materials, particularly copper, so that this agent cannot be applied to semiconductor substrates having a copper wiring portion that is the main stream in recent years.

On the other hand, cleaning agents containing citric acid as a main ingredient have been proposed as cleaning agents which do not corrode metallic materials (see Japanese Patent Laid-Open Publication No. 72594/1998 and "Semiconductor World", No. 3, p. 92 (1997)). However, it cannot be said that these cleaning agents have sufficiently high contamination-removing capability, and they cannot meet the requirements of the recent strict contamination control.

From the above viewpoints, there have been desired cleaning agents which exhibit sufficiently high contamination-removing capability and meet the requirements of the recent strict contamination control without corroding metallic materials, particularly copper.

OBJECT OF THE INVENTION

The present invention is intended to solve such problems associated with the prior art as described above, and it is an object of the invention to provide a cleaning composition which exhibits high ability to remove impurities, such as residual abrasives, residual polishing dust and metal ions, without corroding a metal wiring portion when it is used to remove contamination of a surface of a semiconductor substrate having a metal wiring portion after chemical mechanical polishing of the semiconductor substrate. It is also an object of the invention to provide a cleaning method capable of efficiently removing contamination of a polished surface of the semiconductor substrate after chemical mechanical polishing. Further, it is also an object of the invention to provide a process for manufacturing a high-quality semiconductor device free from contamination by impurities or the like.

SUMMARY OF THE INVENTION

The present inventors have earnestly studied to solve the above problems, and as a result, they have found that the objects of the present invention can be achieved by the use of a cleaning composition containing organic polymer particles having a crosslinked structure and a surfactant. Based on the finding, the present invention has been accomplished.

That is to say, the cleaning composition according to the present invention comprises organic polymer particles (A) having a crosslinked structure and a surfactant (B) and is used after chemical mechanical polishing.

The organic polymer particles (A) having a crosslinked structure preferably have at least one functional group selected from the group consisting of a carboxyl group, a hydroxyl group, an amino group, a sulfonic acid group and —$N^+R_3$ (R is a hydrogen atom or an alkyl group of 1 to 4 carbon atoms). The organic polymer particles (A) having a crosslinked structure preferably have an average dispersed particle diameter of 120 to 500 nm. Further, the organic polymer particles (A) having a crosslinked structure are preferably particles comprising a copolymer of an unsaturated monomer (a1) containing a carboxyl group, a polyfunctional monomer (a2) and an unsaturated monomer (a3) other than the monomers (a1) and (a2).

The method for cleaning a semiconductor substrate according to the present invention comprises cleaning a semiconductor substrate given after chemical mechanical polishing, by the use of the above-mentioned cleaning composition. The cleaning is preferably at least one cleaning selected from the group consisting of on-table cleaning, brush-scrub cleaning and roll cleaning.

The process for manufacturing a semiconductor device according to the present invention comprises a step of chemically and mechanically polishing a semiconductor substrate and a step of cleaning the semiconductor substrate obtained after the chemical mechanical polishing, by the above-mentioned cleaning method.

BRIEF DESCRIPTION OF THE DRAWINGS

FIG. 1(a) is a sectional view showing an example of a semiconductor substrate before chemical mechanical polishing. FIG. 1(b) is a sectional view showing an example of a semiconductor substrate after chemical mechanical polishing.

Figure 1:
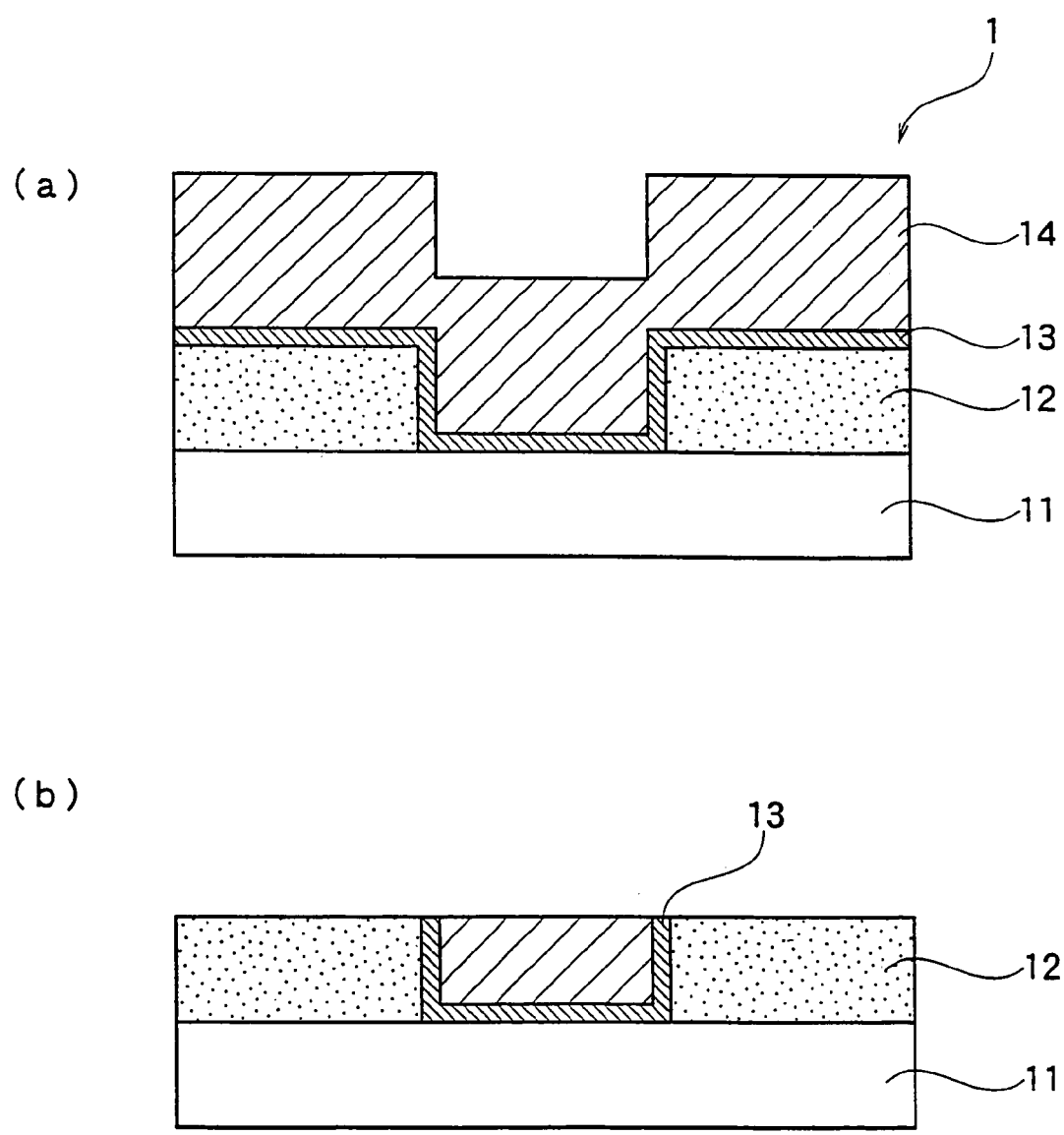
FIG. 1 is a group of sectional views each of which shows an example of a semiconductor substrate used in the present invention.

1: semiconductor substrate stock
11: base substrate (made of, for example, silicon)
12: insulating film (made of, for example, PETEOS)
13: barrier metal film
14: metal film

PREFERRED EMBODIMENTS OF THE INVENTION

[Cleaning Composition]

The cleaning composition according to the invention comprises organic polymer particles (A) having a crosslinked structure and a surfactant (B).

(A) Organic Polymer Particles having Crosslinked Structure

The organic polymer particles (A) for use in the invention have a crosslinked structure (these particles are referred to as "crosslinked organic polymer particles (A)" hereinafter). By the use of the crosslinked organic polymer particles (A), a cleaning composition capable of maintaining or improving ability of conventional cleaning agents to remove impure metal ions and capable of inhibiting occurrence of surface defects can be obtained.

The crosslinked organic polymer particles (A) preferably have at least one functional group selected from the group consisting of a carboxyl group, a hydroxyl group, an amino group, a sulfonic acid group and —N$^+$R$_3$ (R is a hydrogen atom or an alkyl group of 1 to 4 carbon atoms). By the use of the crosslinked organic polymer particles (A) having such a functional group, high ability to remove impure metal ions can be exhibited. Of the above functional groups, preferable are a carboxyl group and a hydroxyl group, and more preferable is a carboxyl group.

The crosslinked organic polymer particles (A) have an average dispersed particle diameter of preferably 100 to 1,000 nm, more preferably 120 to 500 nm, still more preferably 150 to 250 nm. When the average dispersed particle diameter is in the above range, a cleaning composition excellent in both of the stability and the contamination-removing capability can be obtained.

Examples of the crosslinked organic polymer particles (A) include particles comprising a copolymer of an unsaturated monomer (a1) containing a carboxyl group, a polyfunctional monomer (a2) and an unsaturated monomer (a3) other than the monomers (a1) and (a2).

(a1) Unsaturated Monomer Containing Carboxyl Group

The unsaturated monomer (a1) containing a carboxyl group is a monomer having a carboxyl group and a polymerizable unsaturated bond, and is, for example, an unsaturated monocarboxylic acid, an unsaturated polycarboxylic acid or a mono[(meth)acryloyloxyalkyl] ester of a polycarboxylic acid.

Examples of the unsaturated monocarboxylic acids include (meth)acrylic acid, crotonic acid, α-chloroacrylic acid and cinnamic acid.

Examples of the unsaturated polycarboxylic acids include maleic acid, maleic anhydride, fumaric acid, itaconic acid, itaconic anhdyride, citraconic acid, citraconic anhydride and mesaconic acid.

Examples of the mono[(meth)acryloyloxyalkyl] esters of polycarboxylic acids include mono[2-(meth)acryloyloxyethyl] succinate and mono[2-(meth)acryloyloxyethyl] phthalate.

The unsaturated monomers containing a carboxyl group mentioned above can be used singly or as a mixture of two or more kinds. Of the above-mentioned unsaturated monomers (a1) containing a carboxyl group, preferable are unsaturated monocarboxylic acids, and more preferable is (meth)acrylic acid.

(a2) Polyfunctional Monomer

The polyfunctional monomer (a2) is a monomer having two or more polymerizable unsaturated bonds. The polyfunctional monomer (a2) is, for example, a divinyl aromatic compound or a polyfunctional (meth)acrylate.

Examples of the divinyl aromatic compounds include divinylbenzene.

Examples of the polyfunctional (meth)acrylates include di(meth)acrylates, such as diethylene glycol di(meth)acrylate, triethylene glycol di(meth)acrylate, polyethylene glycol di(meth)acrylate, 1,3-butylene glycol di(meth)acrylate, 1,4-butylene glycol di(meth)acrylate, 1,6-hexane glycol di(meth)acrylate, neopentyl glycol di(meth)acrylate, dipropylene glycol di(meth)acrylate, polypropylene glycol di(meth)acrylate and 2,2'-bis(4-methacryloxydiethoxyphenyl)propane; tri(meth)acrylates, such as trimethylolethane tri(meth)acrylate, tetramethylolmethane tri(meth)acrylate, trimethylolpropane tri(meth)acrylate and pentaerythritol triacrylate: and tetrafunctional or more functional acrylates, such as tetramethylolmethane tetraacrylate.

The polyfunctional monomers mentioned above can be used singly or as a mixture of two or more kinds. Of the above-mentioned polyfunctional monomers (a2), preferable are divinyl aromatic compounds, di(meth)acrylates and tri(meth)acrylates, and more preferable are divinylbenzene, ethylene glycol dimethacrylate, trimethylolpropane tri(meth)acrylate and pentaerythritol triacrylate.

(a3) Unsaturated Monomer other than the Monomers (a1) and (a2)

The unsaturated monomer (a3) is a monomer other than the unsaturated monomer (a1) containing a carboxyl group and the polyfunctional monomer (a2), and has at least one polymerizable unsaturated bond. The unsaturated monomer (a3) is, for example, an aromatic vinyl compound, an unsaturated carboxylic acid ester, an unsaturated carboxylic acid aminoalkyl ester, an unsaturated amide or an aliphatic conjugated diene.

Examples of the aromatic vinyl compounds include styrene, α-methylstyrene, o-vinyltoluene, m-vinyltoluene, p-vinyltoluene, p-chlorostyene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether and p-vinylbenzyl glycidyl ether.

Examples of the unsaturated carboxylic acid esters include methyl (meth)acrylate, ethyl (meth)acrylate, n-propyl (meth)acrylate, i-propyl (meth)acrylate, n-butyl (meth) acrylate, i-butyl (meth) acrylate, sec-butyl (meth) acrylate, t-butyl (meth) acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, cyclohexyl (meth)acrylate, phenyl (meth)acrylate, 2-methoxyethyl (meth)acrylate, 2-phenoxyethyl (meth)acrylate, methoxydiethylene glycol (meth)acrylate, methoxytriethylene glycol (meth)acrylate, methoxypropylene glycol (meth)acrylate, methoxydipropylene glycol (meth)acrylate, isobornyl (meth)acrylate, dicyclopentadienyl (meth)acrylate, 2-hydroxy-3-phenoxypropyl (meth)acrylate and glycerol mono(meth)acrylate.

Examples of the unsaturated carboxylic acid aminoalkyl esters include 2-aminoethyl (meth)acrylate, 2-dimethylaminoethyl (meth)acrylate, 2-aminopropyl (meth)acrylate, 2-dimethylaminopropyl (meth)acrylate, 3-aminopropyl (meth)acrylate and 3-dimethylaminopropyl (meth)acrylate.

Examples of the unsaturated amides include (meth)acrylamide, α-chloroacrylamide and N-2-hydroxyethyl (meth)acrylamide.

Examples of the aliphatic conjugated dienes include 1,3-butadiene, isoprene and chloroprene.

The unsaturated monomers mentioned above can be used singly or as a mixture of two or more kinds. Of the above-mentioned unsaturated monomers (a3), preferable are aromatic vinyl compounds and unsaturated carboxylic acid esters, and more preferable are styrene, α-methylstyrene, methyl (meth)acrylate, cyclohexyl (meth)acrylate and phenyl (meth)acrylate.

When the crosslinked organic polymer particles (A) are particles comprising a copolymer of the unsaturated monomer (a1) containing a carboxyl group, the polyfunctional monomer (a2) and the unsaturated monomer (a3) other than the monomers (a1) and (a2), their copolymerization proportions are as follows. It is preferable that the proportion of the unsaturated monomer (a1) containing a carboxyl group is in the range of 0.5 to 20% by mass, the proportion of the polyfunctional monomer (a2) is in the range of 1 to 70% by mass, and the proportion of the unsaturated monomer (a3) is in the range of 10 to 98.5% by mass; it is more preferable that the proportion of the unsaturated monomer (a1) containing a carboxyl group is in the range of 1 to 15% by mass, the proportion of the polyfunctional monomer (a2) is in the range of 2 to 60% by mass, and the proportion of the unsaturated monomer (a3) is in the range of 25 to 97% by mass; and it is still more preferable that the proportion of the unsaturated monomer (a1) containing a carboxyl group is in the range of 3 to 15% by mass, the proportion of the polyfunctional monomer (a2) is in the range of 5 to 50% by mass, and the proportion of the unsaturated monomer (a3) is in the range of 35 to 92% by mass.

The copolymer can be prepared by a conventional polymerization process, such as solution polymerization, emulsion polymerization or suspension polymerization. The polymerization conditions such as polymerization temperature and polymerization time can be arbitrarily chosen depending on kinds of monomers which should be copolymerized and properties of copolymer such as molecular weight.

(B) Surfactant

The surfactant (B) for use in the invention is preferably an anionic surfactant or a nonionic surfactant.

Examples of the anionic surfactants include alkyl sulfuric acid esters, such as lauryl sulfate; alkylbenzenesulfonic acids, such as dodecylbenzenesulfonic acid; alkylnaphthalenesulfonic acids; sulfuric acid esters of polyoxyethylene alkyl ethers, such as polyoxyethylene lauryl sulfate; naphthalenesulfonic acid condensate; polymers of unsaturated carboxylic acids, such as poly(meth)acrylic acid and acrylic acid/methacrylic acid copolymer; and lignin sulfonic acid. These anionic surfactants may be used in the form of salts. In this case, examples of counter cations include sodium ion, potassium ion and ammonium ion. Of these, preferable are potassium ion and ammonium ion.

Examples of the nonionic surfactants include polyoxyethylene alkyl ethers, such as polyoxyethylene lauryl ether, polyoxyethylene cetyl ether, polyoxyethylene stearyl ether and polyoxyethylene oleyl ether; polyoxyethylene aryl ethers, such as polyoxyethylene octylphenyl ether and polyoxyethylene nonylphenyl ether; sorbitan fatty acid esters, such as sorbitan monolaurate, sorbitan monopalmitate and sorbitan monostearate; and polyoxyethylene sorbitan fatty acid esters, such as polyoxyethylene sorbitan monolaurate, polyoxyethylene sorbitan monopalmitate and polyoxyethylene sorbitan monostearate.

The surfactants mentioned above can be used singly or as a mixture of two or more kinds. Of the above-mentioned surfactants (B), preferable are alkyl sulfuric acid esters, alkylbenzenesulfonic acids, alkylnaphthalenesulfonic acids and polyoxyethylene alkyl ethers, and more preferable are ammonium lauryl sulfate, dodecylbenzenesulfonic acid, potassium dodecylbenzenesulfonate, potassium alkylnaphthalenesulfonate and polyoxyethylene lauryl ether.

The cleaning composition of the invention may further contain other components, such as an organic acid (C) and a complexing agent (D), when need, in addition to the crosslinked organic polymer particles (A) and the surfactant (B). In the cleaning composition of the invention, the above components are preferably dissolved or dispersed in an appropriate solvent.

(C) Organic Acid

The organic acid (C) for use in the invention plays a role to ionize metals, particularly copper, metal oxides, particularly copper oxide, and the like, and thereby accelerate formation of an ionic compound that is soluble in the later-described solvent.

Such an organic acid (C) is preferably a compound having at least one carboxyl group. In the case where a nitrogen atom is contained in a molecule of the organic acid (C), it is preferable that the carboxyl group is not bonded to the nitrogen atom. The organic acid (C) may further have a hydroxyl group and/or an amino group.

Examples of the organic acids (C) include monocarboxylic acids, such as formic acid, acetic acid and propionic acid; dicarboxylic acids, such as oxalic acid, malonic acid, succinic acid, glutaric acid, adipic acid, pimelic acid, maleic acid, fumaric acid and phthalic acid; tricarboxylic acids, such as trimellitic acid and tricarballylic acid; oxycarboxylic acids, such as oxymonocarboxylic acids (e.g., hydroxybutyric acid, lactic acid, salicylic acid), oxydicarboxylic acids (e.g., malic acid, tartaric acid) and oxytricarboxylic acids (e.g., citric acid); and amino acids, such as aspartic acid and glutamic acid.

The organic acids mentioned above can be used singly or as a mixture of two or more kinds. Of the above-mentioned organic acids (C), preferable are dicarboxylic acids and oxycarboxylic acids, and more preferable are oxalic acid, malonic acid, succinic acid, tartaric acid and citric acid.

(D) Complexing Agent

The complexing agent (D) for use in the invention has a function of being coordinated to a metal ion (particularly copper ion), which has been solubilized by the action of the cleaning composition of the invention, and thereby stabilized to surely remove the formed complex.

Examples of the complexing agents (D) include aminopolycarboxylic acids, such as ethylenediaminetetraacetic acid [EDTA] and trans-1,2-diaminocyclohexanetetraacetic acid [CyDTA]; phosphonic acids, such as ethylenediaminetetra (methylenephosphonic acid) [EDTPO], ethylenediaminedi (methylenephosphonic acid) [EDDPO], nitrilotris(methylenephosphonic acid) [NTPO] and 1-hydroxyethylidene-1,1'-diphosphonic acid [HEDPO]; condensed phosphoric acids, such as tripolyphosphoric acid and hexametaphosphoric acid; diketones, such as acetylacetone and hexafluoroacetylacetone; amines, such as ethylenediamine and triethanolamine; and inorganic ions, such as thiocyanate ion, thiosulfate acid ion and ammonium ion.

Of the complexing agents mentioned above, preferable are aminopolycarboxylic acids, phosphonic acids and amines, and more preferable are ethylenediaminetetraacetic acid, ethylenediaminetetra(methylenephosphonic acid), nitrilotris(methylenephosphonic acid), ethylenediamine and triethanolamine.

(E) Solvent

The solvent for use in the invention is, for example, water or a mixed solvent of water and an alcohol. Examples of the alcohols include methanol, ethanol and isopropanol. Of these solvents, water is preferably employed.

<Cleaning Composition>

In the cleaning composition of the invention, the content of the crosslinked organic polymer particles (A) is in the range of preferably 0.001 to 5.0% by mass, more preferably 0.001 to 1.0% by mass, still more preferably 0.001 to 0.5% by mass. The content of the surfactant (B) is in the range of preferably 0.0001 to 5% by mass, more preferably 0.001 to 1% by mass, still more preferably 0.001 to 0.5% by mass. When the contents of the crosslinked organic polymer particles (A) and the surfactant (B) are in the above ranges, the crosslinked organic polymer particles (A) are homogeneously dispersed to give a stable cleaning composition, and moreover, an effect of removing abrasives and metallic foreign substances can be sufficiently exerted.

When the cleaning composition of the invention contains an organic acid (C), the content of the organic acid (C) is preferably not more than 5% by mass, more preferably 0.001 to 1% by mass, still more preferably 0.001 to 0.5% by mass. When the content of the organic acid (C) is in the above range, an effect of accelerating formation of a soluble ionic-compound can be sufficiently exerted.

When the cleaning composition of the invention contains a complexing agent (D), the content of the complexing agent (D) is preferably not more than 5% by mass, more preferably 0.001 to 3% by mass, still more preferably 0.01 to 3% by mass. When the content of the complexing agent (D) is in the above range, the complexing agent is coordinated to the solubilized metal ion or the like and thereby stabilized, whereby an effect of surely removing the formed complex can be sufficiently exerted.

The cleaning composition of the invention has pH of preferably not more than 12, more preferably 2 to 11, still more preferably 2 to 6. When the pH is in the above range, the cleaning composition can exhibit satisfactory contamination-removing capability without corroding a metal wiring portion.

When the cleaning composition contains an organic acid (C), pH of the cleaning composition can be controlled by adjusting the amount of the organic acid added. pH of the composition can be controlled also by adding an appropriate inorganic acid or basic substance. Examples of the inorganic acids include hydrochloric acid, nitric acid and sulfuric acid. Examples of the basic substances include hydroxides of alkali metals, such as sodium hydroxide, potassium hydroxide, rubidium hydroxide and cesium hydroxide, and ammonia. Of these basic substances, preferable are ammonia and potassium hydroxide.

The concentration of each component in the cleaning composition of the invention has only to be in the above range at the time the composition is used. That is to say, the components may be directly blended so that the concentration of each component should be in the above range, and the resulting composition is used, or a composition having a higher concentration of each component than the above-mentioned preferred concentration, which is in a concentrated state, is first prepared, and prior to use, a solvent is added to dilute the composition so that each concentration should be in the above-mentioned preferred range.

The composition in a concentrated state can be prepared by increasing concentrations of other components than the solvent with maintaining the ratio between the preferred concentration ranges. In this case, the concentration of the crosslinked organic polymer particles (A) contained in the concentrated composition is preferably not more than 30% by mass, more preferably not more than 15% by mass, and the concentration of the surfactant (B) contained therein is preferably not more than 15% by mass, more preferably not more than 10% by mass. When the cleaning composition of the invention contains an organic acid (C), the concentration of the organic acid (C) contained in the concentrated composition is preferably not more than 15% by mass, more preferably not more than 10% by mass. When the cleaning composition of the invention contains a complexing agent (D), the concentration of the complexing agent (D) contained in the concentrated composition is preferably not more than 15% by mass, more preferably not more than 10% by mass. When the concentration of each component in the concentrated composition is in the above range, the cleaning composition of the invention can be stably stored in a concentrated state, and even when the composition is diluted and used after it is stored for a long period of time, the expected performance can be exhibited.

[Method for Cleaning Semiconductor Substrate and Process for Manufacturing Semiconductor Device]

The method for cleaning a semiconductor substrate according to the invention is a method to clean a semiconductor substrate given after chemical mechanical polishing by the use of the cleaning composition of the invention. The process for manufacturing a semiconductor device according to the invention is a process comprising a step of chemically and mechanically polishing a semiconductor substrate and a step of cleaning the semiconductor substrate obtained after the chemical mechanical polishing, by the cleaning method of the invention.

The semiconductor substrate is, for example, a semiconductor substrate having, on a surface to be polished, at least one material selected from a metallic material to form a wiring portion (herein after, referred to as "metallic wiring material"), a barrier metal and an insulating material. Preferable is a semiconductor substrate having, on a surface to be polished, at least a metallic wiring material.

Examples of the metallic wiring materials include tungsten, aluminum, copper and an alloy containing at least one of these metals. Of these metallic wiring materials, preferable are copper and an alloy containing copper.

Examples of the barrier metals include tantalum, tantalum nitride, titanium, titanium nitride and ruthenium. Of these barrier metals, preferable are tantalum and tantalum nitride.

Examples of the insulating films include a thermally-oxidized film, a PETEOS film (plasma enhanced-TEOS film), a HDP film (high density plasma enhanced-TEOS film), a silicon oxide film obtained by a thermal CVD method, a boron phosphorus silicate film (BPSG film), an insulating film called FSG, and an insulating film of a low-dielectric constant.

The thermally oxidized film can be prepared by exposing silicon of high temperature to an oxidizing atmosphere to subject silicon and oxygen or silicon and water to chemical reaction.

The PETEOS film can be prepared by chemical vapor deposition using tetraethyl orthosilicate (TEOS) as a raw material and applying plasma as the acceleration conditions.

The HDP film can be prepared by chemical vapor deposition using tetraethyl orthosilicate (TEOS) as a raw material and applying high-density plasma as the acceleration conditions.

The silicon oxide film obtained by a thermal CVD method can be prepared by an atmospheric pressure CVD method (AP-CVD method) or a low-pressure CVD method (LP-CVD method).

The boron phosphorus silicate film (BPSG film) can be prepared by an atmospheric pressure CVD method (AP-CVD method) or a low pressure CVD method (LP-CVD method).

The insulating film called FSG can be prepared by chemical vapor deposition applying high-density plasma as the acceleration conditions.

Examples of the low-dielectric constant insulating films include an organic SOG film, a hydrogen-containing SOG film, a low-dielectric constant film comprising an organic polymer, a SiOF-based low-dielectric constant film or a SiOC-based low-dielectric constant film. The "SOG" film used herein is an abbreviation for a "spin on glass" film, and means an insulating film formed by applying a precursor onto a base substrate and then subjecting it to heat treatment or the like.

The organic SOG film comprises silicon oxide containing an organic group such as a methyl group, and can be specifically obtained by applying a precursor containing a mixture of tetraethoxysilane and methyltrimethoxysilane onto a base substrate and then subjecting it to heat treatment or the like.

The hydrogen-containing SOG film comprises silicon oxide containing a silicon-hydrogen bond, and can be specifically obtained by applying a precursor containing triethoxysilane onto a base substrate and then subjecting it to heat treatment or the like.

The low-dielectric constant film comprising an organic polymer is, for example, a low-dielectric constant film containing polyarylene, polyimide, polybenzocyclobutene or polyethylene fluoride as a main component.

The SiOF-based low-dielectric constant film comprises silicon oxide containing a fluorine atom, and can be obtained by, for example, adding fluorine to a silicon oxide film obtained by a chemical vapor deposition method (i.e., doping the film with fluorine).

The SiOC-based low-dielectric constant film comprises silicon oxide containing a carbon atom, and can be obtained by, for example, a chemical vapor deposition method using a mixture of silicon tetrachloride and carbon monoxide as a raw material.

Of the low-dielectric insulating films mentioned above, the organic SOG film, the hydrogen-containing SOG film and the low-dielectric film comprising an organic polymer may have fine pores in the films.

The semiconductor substrate used in the process for manufacturing a semiconductor device according to the invention is not specifically restricted provided that it is a semiconductor substrate having the above-mentioned material (film) on a surface to be polished, but preferable is a semiconductor substrate comprising a base substrate made of silicon or the like, an insulating film provided thereon which has a trench for forming a metal wiring portion, a barrier metal film provided on the insulating film, and a metallic wiring material overlaid on the barrier metal film. An example of a sectional drawing of the semiconductor substrate is shown in FIG. 1(a). The semiconductor substrate 1 shown in FIG. 1(a) consists of a base substrate 11 made of, for example, silicon, an insulating film 12, a barrier metal film 13 and a metal film 14 for forming a wiring portion.

In the process for manufacturing a semiconductor device according to the invention, excess barrier metal and metallic wiring material other than those in the trench are removed by a conventional chemical mechanical polishing method.

A chemical mechanical polishing aqueous dispersion for use in the chemical mechanical polishing contains abrasives, an organic acid and an oxidizing agent, and may further contain an inorganic acid and a complexing agent, when needed. In the case where a polishing aqueous dispersion containing an inorganic acid and a complexing agent is used, the cleaning composition of the invention exerts its maximum effect.

Examples of the abrasives include inorganic oxides, organic particles and organic-inorganic composite particles. Of these, preferable are silica, ceria, alumina and organic-inorganic composite particles. The "organic-inorganic composite particles" mean particles wherein an organic particle and an inorganic particle are united by the electrostatic or chemical action.

The organic acid is preferably an organic acid having two or more carboxyl groups in one molecule, and examples of such organic acids include oxalic acid, maleic acid, malic acid, succinic acid and citric acid.

Examples of the oxidizing agents include hydrogen peroxide and ammonium persulfate.

Examples of the inorganic acids include nitric acid and sulfuric acid.

Examples of the complexing agents include a monocyclic compound having a five-membered heterocyclic ring or a six-membered heterocyclic ring having at least one nitrogen atom, and a compound having a condensed ring constituted of a benzene ring or a naphthalene ring and a five-membered heterocyclic ring or a six-membered heterocyclic ring having at least one nitrogen atom.

Examples of the monocyclic compounds include quinolinic acid and pyridinecarboxylic acid.

Examples of the compound having a condensed ring include a compound having a condensed ring structure selected from a quinoline structure, an isoquinoline structure, a benzotriazole structure, a benzimidazole structure, an indole structure, an isoindole structure, a quinazoline structure, a cinnoline structure, a quinoxaline structure, a phthalazine structure and an acridine structure. Preferable is a compound having a quinoline structure, a benzotriazole structure or a benzimidazole structure. Specific examples of the compounds having a condensed ring include quinaldinic acid, quinolinol, benzotriazole, benzimidazole, hydroxybenzotriazole and carboxybenzotriazole.

The complexing agent for use in the invention is preferably quinolinic acid, quinaldinic acid, quinolinol or benzotriazole.

When the excess barrier metal and metallic wiring material are removed in the present invention, it is not necessary to use the polishing aqueous dispersion throughout the chemical mechanical polishing step, and the polishing aqueous dispersion has only to be used in a part of the polishing step, preferably in the final stage of the polishing step. The cleaning composition of the invention sufficiently exerts its effect on the semiconductor substrate having been polished using the polishing aqueous dispersion in a part of the polishing step, preferably in the final stage of the polishing step.

The semiconductor substrate from which the excess barrier metal and metallic wiring material have been removed in the chemical mechanical polishing step has a section shown in, for example, FIG. 1(b). After the polishing, abrasives, polishing dust, metal ions and the like (not shown) often remain on the insulating film 12 and the metal film 14 for forming a wiring portion of the polished surface. The method for cleaning a semiconductor substrate according to the invention is a method to remove such residues from the semiconductor substrate surface by the use of the cleaning composition.

The cleaning method of the invention can be carried out similarly to a conventional method, such as on-table cleaning, brush-scrub cleaning or roll cleaning, except for using the cleaning composition of the invention. In the present invention, the cleaning method exemplified above may be carried out only once, but may be carried out two or more times. When cleaning is carried out two or more times, the same method may be repeated, or different methods may be used in combination. Further, cleaning may be carried out plural times combining the cleaning method of the invention using the cleaning composition of the invention with a conventional cleaning method, such as a cleaning method using pure water. In this case, the cleaning method of the invention and the conventional cleaning method may be carried out in any order.

The cleaning conditions can be arbitrarily selected. For example, in the case of the on-table cleaning, the head rotating speed is in the range of preferably 10 to 150 rpm, more preferably 20 to 100 rpm; the head load is in the range of preferably 5 to 350 g/cm$^2$, more preferably 10 to 210 g/cm$^2$; the table rotating speed is in the range of preferably 10 to 150 rpm, more preferably 20 to 100 rpm; the feed rate of the cleaning composition is in the range of preferably 50 to 400 ml/min, more preferably 100 to 300 ml/min; and the cleaning time is in the range of preferably 5 to 120 seconds, more preferably 10 to 100 seconds. In the case of the brush-scrub cleaning or the roll cleaning, generally, the cleaning of the semiconductor substrate is carried out by slipping the substrate between two brushes or two rolls. The rotating speed of each brush or each roll can be set in same speed, or when needed, can be set in different speed. While the cleaning conditions are independently set depending on a cleaning apparatus or cleaning unit, the cleaning conditions which are applied for the cleaning process using a common cleaning agent can be applied for the cleaning process according to the present invention. For example, the rotating speed of brush or roll is in the range of preferably 10 to 500 rpm, more preferably 30 to 300 rpm; the substrate rotating speed is in the range of preferably 10 to 300 rpm, more preferably 30 to 200 rpm; the feed rate of the cleaning composition is in the range of preferably 10 to 500 ml/min, more preferably 50 to 300 ml/min; and the cleaning time is in the range of preferably 5 to 120 seconds, more preferably 10 to 100 seconds.

EFFECT OF THE INVENTION

According to the present invention, there can be obtained a cleaning composition which exhibits high ability to remove impurities, such as residual abrasives, residual polishing dust and metal ions, without corroding a metal wiring portion when it is used to remove contamination of a surface of a semiconductor substrate having the metal wiring portion after the chemical mechanical polishing of the semiconductor substrate. By cleaning the polished surface of the semiconductor substrate using the cleaning composition after the chemical mechanical polishing, contamination of the polished surface can be efficiently removed. Further, a high-quality semiconductor device free from contamination by impurities or the like can be manufactured.

EXAMPLES

The present invention is further described with reference to the following examples, but it should be construed that the invention is in no-way limited to those examples.

[A] Preparation of Cleaning Composition (1) Preparation of Organic Polymer Particle-Containing Water Dispersion

Preparation Example A1

In a flask, as monomers, 5 parts by mass of methacrylic acid, 20 parts by mass of divinylbenzene, and 75 parts by mass of styrene; 2 parts by mass of ammonium persulfate as a polymerization initiator; 0.1 part by mass of dodecylbenzenesulfonic acid as a surfactant; and 400 parts by mass of ion-exchanged water as a solvent were placed, and they were heated to 70° C. with stirring in a nitrogen atmosphere and then further stirred at the same temperature for 8 hours to perform polymerization. Thus, a water dispersion containing organic polymer particles (1) (referred to as "crosslinked organic polymer particles (1)" hereinafter) having a carboxyl group and a crosslinked structure and having an average dispersed particle diameter of 210 nm was obtained. Then, ion-exchanged water was added to the water dispersion to adjust the content of the crosslinked organic polymer particles (1) to 10% by mass.

Preparation Example A2

A water dispersion containing organic polymer particles (2) (referred to as "crosslinked organic polymer particles (2)" hereinafter) having a carboxyl group and a crosslinked structure and having an average dispersed particle diameter of 190 nm was obtained in the same manner as in Preparation Example A1, except that 5 parts by mass of methacrylic acid, 10 parts by mass of trimethylolpropane triacrylate, 35 parts by mass of styrene and 50 parts by mass of methyl methacrylate were used as monomers. Then, ion-exchanged water was added to the water dispersion to adjust the content of the crosslinked organic polymer particles (2) to 10% by mass.

Preparation Example A3

A water dispersion containing organic polymer particles (3) (referred to as "crosslinked organic polymer particles (3)" hereinafter) having a carboxyl group and a crosslinked structure and having an average dispersed particle diameter of 250 nm was obtained in the same manner as in Preparation Example A1, except that 5 parts by mass of acrylic acid, 10 parts by mass of divinylbenzene, 45 parts by mass of styrene and 40 parts by mass of methyl methacrylate were used as monomers. Then, ion-exchanged water was added to the water dispersion to adjust the content of the crosslinked organic polymer particles (3) to 10% by mass.

Preparation Example A4

A water dispersion containing organic polymer particles (a) (referred to as "non-crosslinked organic polymer particles (a)" hereinafter) having a carboxyl group, having no crosslinked structure and having an average dispersed particle diameter of 200 nm was obtained in the same manner as in Preparation Example A1, except that 5 parts by mass of methacrylic acid and 95 parts by mass of styrene were used as monomers. Then, ion-exchanged water was added to the water dispersion to adjust the content of the non-crosslinked organic polymer particles (a) to 10% by mass.

The monomers used in Preparation Examples A1 to A4 are set forth in Table 1.

TABLE 1

|  |  | Prep. Ex. A1 crosslinked organic polymer particles (1) | Prep. Ex. A2 crosslinked organic polymer particles (2) | Prep. Ex. A3 crosslinked organic polymer particles (3) | Prep. Ex. A4 non-crosslinked organic polymer particles (4) |
|---|---|---|---|---|---|
| monomer | styrene | 75 | 35 | 45 | 95 |
|  | methyl methacrylate | — | 50 | 40 | — |
|  | methacrylic acid | 5 | 5 | — | 5 |
|  | acrylic acid | — | — | 5 | — |
|  | divinylbenzene | 20 | — | 10 | — |
|  | trimethylolpropane triacrylate | — | 10 | — | — |

Unit of amount: part(s) by mass
—: The corresponding monomer was not used.

(2) Preparation of Cleaning Composition (2-1) Preparation of Cleaning Compositions (1) to (3)

In a polyethylene container, the water dispersion containing the crosslinked organic polymer particles shown in Table 2, said dispersion being prepared in the above preparation example, in the amount shown in Table 2 in terms of the crosslinked organic polymer particles and a surfactant of the type and in the amount shown in Table 2 were placed, and they were stirred for 15 minutes. Then, ion-exchanged water was added to the mixture so that the total amount of all the constituents should become 100 parts by mass, and then the mixture was filtered through a filter having a pore size of 5 μm to give each of cleaning compositions (1) to (3). The pH values of these compositions are set forth in Table 2.

(2-2) Preparation of Cleaning Compositions (4) to (6)

In a polyethylene container, the water dispersion containing the crosslinked organic polymer particles shown in Table 2, said dispersion being prepared in the above preparation example, in the amount shown in Table 2 in terms of the crosslinked organic polymer particles, a surfactant of the type and in the amount shown in Table 2 and an organic acid of the type and in the amount shown in Table 2 were placed, and they were stirred for 15 minutes. Then, ion-exchanged water was added to the mixture so that the total amount of all the constituents should become 100 parts by mass, and then the mixture was filtered through a filter having a pore size of 5 μm to give each of cleaning compositions (4) to (6). The pH values of these compositions are set forth in Table 2.

(2-3) Preparation of Cleaning Compositions (7) to (10)

In a polyethylene container, the water dispersion containing the crosslinked organic polymer particles shown in Table 2, said dispersion being prepared in the above preparation example, in the amount shown in Table 2 in terms of the crosslinked organic polymer particles, a surfactant of the type and in the amount shown in Table 2, an organic acid of the type and in the amount shown in Table 2 and a complexing agent of the type and in the amount shown in Table 2 were placed, and they were stirred for 15 minutes. Then, ion-exchanged water was added to the mixture so that the total amount of all the constituents should become 100 parts by mass, and then the mixture was filtered through a filter having a pore size of 5 μm to give each of cleaning compositions (7) to (10). The pH values of these compositions are set forth in Table 2.

(2-4) Preparation of Cleaning Composition (11)

In a polyethylene container, 0.02 part by mass of dodecylbenzenesulfonic acid as a surfactant and 0.4 part by mass of citric acid as an organic acid were placed, and they were stirred for 15 minutes. Then, ion-exchanged water was added to the mixture so that the total amount of all the constituents should become 100 parts by mass, and then the mixture was filtered through a filter having a pore size of 5 μm to give a cleaning composition (11). The pH value of this composition is set forth in Table 2.

(2-5) Preparation of Cleaning Composition (12)

In a polyethylene container, the water dispersion containing the non-crosslinked organic polymer particles (a), said dispersion being prepared by Preparation Example A4, in an amount of 0.10 part by mass in terms of non-crosslinked organic polymer particles, 0.02 part by mass of dodecylbenzenesulfonic acid as a surfactant and 0.2 part by mass of citric acid as an organic acid were placed, and they were stirred for 15 minutes. Then, ion-exchanged water was added to the mixture so that the total amount of all the constituents should become 100 parts by mass, and then the mixture was filtered through a filter having a pore size of 5 μm to give a cleaning composition (12). The pH value of this composition is set forth in Table 2.

TABLE 2

| cleaning composition | organic polymer particles | | surface active agent | | organic acid | | complexing agent | | pH |
|---|---|---|---|---|---|---|---|---|---|
| | type | amount | type | amount | type | amount | type | amount | |
| (1) | crosslinked organic polymer particles (1) | 0.10 | DBSA | 0.02 | — | — | — | — | 4.1 |

TABLE 2-continued

| | | | | | | | | | | |
|---|---|---|---|---|---|---|---|---|---|---|
| (2) | crosslinked organic polymer particles (1) | 0.05 | DBS-K | 0.04 | — | | — | — | — | 3.1 |
| (3) | crosslinked organic polymer particles (2) | 0.10 | ANS-K | 0.05 | — | | — | — | — | 5.0 |
| (4) | crosslinked organic polymer particles (3) | 0.20 | POE lauryl ether | 0.03 | tartaric acid | 0.1 | — | | — | 2.9 |
| (5) | crosslinked organic polymer particles (1) | 0.10 | DBSA | 0.01 | citric acid | 0.2 | — | | — | 3.2 |
| (6) | crosslinked organic polymer particles (1) | 0.10 | DBS-K | 0.02 | oxalic acid | 0.1 | — | | — | 4.0 |

| cleaning composition | organic polymer particles | | surfactant | | organic acid | | complexing agent | | pH |
|---|---|---|---|---|---|---|---|---|---|
| | type | amount | type | amount | type | amount | type | amount | |
| (7) | crosslinked organic polymer particles (1) | 0.10 | DBSA | 0.01 | citric acid | 0.2 | EDTA | 0.2 | 3.1 |
| (8) | crosslinked organic polymer particles (1) | 0.10 | DBSA | 0.01 | citric acid | 0.2 | EDTPO | 0.1 | 3.2 |
| (9) | crosslinked organic polymer particles (1) | 0.10 | DBSA | 0.01 | citric acid | 0.2 | NTPO | 0.4 | 3.1 |
| (10) | crosslinked organic polymer particles (1) | 0.10 | DBSA | 0.01 | citric acid | 0.2 | KSCN | 2.0 | 3.5 |
| (11) | — | — | DBSA | 0.02 | citric acid | 0.4 | — | — | 4.2 |
| (12) | non-crosslinked organic polymer particles (a) | 0.10 | DBSA | 0.02 | citric acid | 0.2 | — | — | 3.1 |

Unit of amount: part(s) by mass
—: The corresponding monomer was not used.
DBSA: dodecylbenzenesulfonic acid
DBS-K: potassium dodecylbenzenesulfonate
ANS-K: potassium alkylnapthalenesulfonate
POE lauryl ether: polyoxyethylene lauryl ether
EDTA: ethylenediaminetetraacetic acid
EDTPO: ethylenediaminetetra (methylenephosphonic acid)
NTPO: nitrotris (methylenephosphonic acid)
KSCN: potassium thiocyanate

[B] Preparation of Chemical Mechanical Polishing Aqueous Dispersion (1) Preparation of Abrasive Grain-Containing Dispersion Preparation Example B1

(Preparation of Water Dispersion Containing Colloidal Silica (1))

In a rotary dispersing apparatus, 70 parts by mass of ammonia water having a concentration of 25% by mass, 40 parts by mass of ion-exchanged water, 170 parts by mass of ethanol and 20 parts by mass of tetraethoxysilane were placed, and they were heated up to 60° C. with rotary stirring at 180 rpm, followed by further stirring at 60° C. for 2 hours. Subsequently, the resulting mixture was cooled to room temperature, and then an operation of removing ethanol by the use of a rotary evaporator with adding ion-exchanged water at 80° C. was repeated several times to give a water dispersion containing 20% by mass of colloidal silica (1) The colloidal silica (1) contained in the water dispersion had an average primary particle diameter of 25 nm and an average secondary particle diameter of 40 nm.

Preparation Example B2

(Preparation of Water Dispersion Containing Colloidal Silica (2))

A water dispersion containing 20% by mass of colloidal silica (2) was obtained in the same manner as in Preparation Example B1, except that the amount of ethanol used was changed to 190 parts by mass from 170 parts by mass and the amount of tetraethoxysilane used was changed to 35 parts by mass from 20 parts by mass. The colloidal silica (2) contained in the water dispersion had an average primary particle diameter of 50 nm and an average secondary particle diameter of 75 nm.

Preparation Example B3

(Preparation of Water Dispersion Containing Fumed Alumina)

To 6.7 kg of ion-exchanged water, 2 kg of fumed alumina particles (available from Degussa AG, trade name: Aluminum Oxide C) were introduced, and the particles were dispersed by an ultrasonic dispersing machine. Then, the resulting dispersion was filtered through a filter having a pore size of 5 μm to give a water dispersion containing the fumed alumina. The alumina contained in the water dispersion had an average dispersed particle diameter of 150 nm.

Preparation Example B4

(Preparation of Water Dispersion Containing Fumed Silica)

In a planetary type kneader "T. K. HIVIS DISPER MIX (R) Model 3D-20" (manufactured by Tokushu KiKa Kogyo Co., Ltd.), 6 kg of ion-exchanged water was placed, and 6 kg of fumed silica particles (available from Nippon Aerosil Co., Ltd., trade name: Aerosil #50, specific surface area measured by BET (Brunauer-Emmett-Teller) method: 52 m²/g) were continuously added over a period of 30 minutes with rotating the twisted blade at a primary rotating speed of 10 rpm and at a secondary rotating speed of 30 rpm. Thereafter, kneading was performed for one hour with rotating the twisted blade at a primary rotating speed of 10 rpm and at a secondary rotating speed of 30 rpm and rotating the Corres type high-speed rotor blade at a primary rotating speed of 10 rpm and at a secondary rotating speed of 2,000 rpm.

Subsequently, to the resulting mixture, 0.3108 g of a potassium hydroxide aqueous solution of 20% by mass was added. Then, the mixture was diluted with ion-exchanged water and filtered through a depth cartridge filter having a pore size of 5 μm to give a water dispersion containing 30% by mass of the fumed silica. The silica contained in the water dispersion had an average dispersed particle diameter of 52 nm.

Preparation Example B5

(Preparation of Water Dispersion Containing Organic Abrasives (1))

In a flask, as monomers, 85 parts by mass of methyl methacrylate, 10 parts by mass of styrene and 5-parts by mass of, acrylic acid; 2 parts by mass of ammonium persulfate as a polymerization initiator; 0.1 part by mass of dedecylbenzenesulfonic acid as a surfactant; and 400 parts by mass of ion-exchanged water as a solvent were placed, and they were heated to 70° C. with stirring in a nitrogen atmosphere and then kept at 80° C. for 8 hours to perform polymerization until the polymerization conversion became 100%. The reaction mixture was diluted with ion-exchanged water to give a water dispersion containing 10% by mass of organic abrasives (1) having an average dispersed particle diameter of 150 nm.

Preparation Example B6

(Preparation of Water Dispersion Containing Organic Abrasives (2))

A water dispersion containing 10% by mass of organic abrasives (2) having an average dispersed particle diameter of 190 nm was obtained in the same manner as in Preparation Example B5, except that 4 parts by mass of methacrylic acid, 91 parts by mass of styrene and 5 parts by mass of divinylbenzene were used as monomers.

(2) Preparation of Chemical Mechanical Polishing Aqueous Dispersions (1) to (10)

In a polyethylene container, the water dispersion containing the abrasives shown in Table 3, said dispersion being prepared in the above preparation example, in the amount shown in Table 3 in terms of the abrasives, an organic acid of the type and in the amount shown in Table 3, a complexing agent of the type and in the amount shown in Table 3 and an oxidizing agent of the type and in the amount shown in Table 3 were placed in this order, and they were stirred for 15 minutes. To the mixture, a pH adjuster shown in Table 3 was added so that the pH of a resultant chemical mechanical polishing aqueous dispersion became the value shown in Table 3, and then ion-exchanged water was further added so that the total amount of all the constituents became 100 parts by weight. Then, the mixture was filtered through a filter having a pore size of 5 μm to give each of chemical mechanical polishing aqueous dispersions (1) to (10). The pH values of these polishing aqueous dispersions are set forth in Table 3.

In the chemical mechanical aqueous dispersions (5), (7) and (8), fumed silica or colloidal silica was used in combination with the organic abrasives.

TABLE 3

| aqueous dispersion | abrasives type | amount | organic acid type | amount | oxidizing agent type | amount | complexing agent type | amount | pH adjuster type | pH |
|---|---|---|---|---|---|---|---|---|---|---|
| (1) | colloidal silica (1) | 5.0 | maleic acid | 0.6 | hydrogen peroxide | 0.5 | quinaldinic acid | 0.2 | potassium hydroxide (solid) | 10.5 |
| (2) | colloidal silica (2) | 3.5 | maleic acid | 0.5 | hydrogen peroxide | 1.0 | — | — | potassium hydroxide (solid) | 10.5 |
| (3) | colloidal silica (1) | 4.0 | citric acid | 0.3 | hydrogen peroxide | 1.5 | quinolinic acid | 0.1 | potassium hydroxide (solid) | 11.0 |
| (4) | fumed alumina | 5.0 | succinic acid | 1.0 | ammonium persulfate | 4.0 | benzotriazole | 0.1 | 10% by mass of aqueous solution of nitric acid | 2.5 |
| (5) | fumed silica organic abrasive (1) | 1.0 0.5 | citric acid | 0.3 | hydrogen peroxide | 1.0 | quinolinic acid | 0.7 | 28% by mass of ammonia water | 11.0 |
| (6) | colloidal silica (1) | 1.0 | malic acid | 0.5 | hydrogen peroxide | 7.0 | benzotriazole | 0.2 | 10% by mass of aqueous solution of nitric acid | 2.5 |
| (7) | colloidal silica (1) organic abrasive (1) | 5.0 1.0 | oxalic acid | 0.3 | hydrogen peroxide | 0.5 | quinaldinic acid | 0.2 | 28% by mass of ammonia water | 11.5 |
| (8) | colloidal silica (1) organic abrasive (1) | 5.0 1.0 | maleic acid | 0.5 | hydrogen peroxide | 0.5 | quinaldinic acid | 0.2 | potassium hydroxide (solid) | 10.5 |
| (9) | fumed silica | 5.0 | maleic acid | 0.5 | hydrogen peroxide | 0.3 | quinaldinic acid | 0.2 | potassium hydroxide (solid) | 8.5 |

TABLE 3-continued

| aqueous dispersion | abrasives type | amount | organic acid type | amount | oxidizing agent type | amount | complexing agent type | amount | pH adjuster type | pH |
|---|---|---|---|---|---|---|---|---|---|---|
| (10) | colloidal silica (1) | 5.0 | oxalic acid | 0.2 | hydrogen peroxide | 3.0 | benzotriazole | 0.3 | 10% by mass of aqueous solution of nitric acid | 3.4 |

Unit of amount: part(s) by mass
—: The corresponding monomer was not used.

[C] Preparation of Low-Dielectric Constant Insulating Film (1) Preparation of Polysiloxane Sol 101.5 g of methyltrimethoxysilane, 276.8 g of methyl methoxypropionate and 9.7 g of a tetraisopropoxytitanium/ ethyl acetoacetate complex were mixed, and the resulting mixture was heated to 60° C. Then, a mixture of 92.2 g of γ-butyrolactone and 20.1 g of water was added dropwise to the mixture over a period of 1 hour with stirring. After the dropwise addition was completed, stirring was further performed at 60° C. for 1 hour to give a polysiloxane sol.

(2) Preparation of Polystyrene Particles

In a flask, 100 parts by mass of styrene, 2 parts by mass of an azo type polymerization initiator (available from Wako Pure Chemical Industries, Ltd., trade name: V60), 0.5 part by mass of potassium dodecylbenzenesulfonate and 400 parts by mass of ion-exchanged water were placed, and they were heated to 70° C. with stirring in a nitrogen atmosphere and subjected to polymerization at the same temperature for 6 hours. Thus, polystyrene particles having an average particle diameter of 150 nm were obtained.

(3) Preparation of Insulating Film of Low-Dielectric Constant 15 g of the polysiloxane sol obtained in the above step (3-1) and 1 g of the polystyrene particles obtained in the above step (3-2) were mixed, and the resulting mixture was applied onto a silicon substrate with a thermally oxidized film, said substrate having a diameter of 8 inches, by spin coating. In an oven, this substrate was heated at 80° C. for 5 minutes, followed by being further heated at 200° C. for 5 minutes. Thereafter, the substrate was heated in vacuo at 340° C. for 30 minutes, then at 360° C. for 30 minutes, then at 380° C. for 30 minutes and further at 450° C. for 1 hour to prepare a substrate having a colorless transparent film (low-dielectric constant insulating film) having a thickness of 2000 Å. A section of the film was observed by a scanning electron microscope, and as a result, it was confirmed that a great number of fine pores were formed. The film had a dielectric constant of 1.98, an elastic modulus of 3 GPa and a porosity of 15%.

[D] Preparation of Metal-Contaminated Substrate

Copper nitrate was dissolved in ultra-pure water to prepare a solution containing copper ion in a concentration of 100 ppb. In this solution, an 8-inch p-type silicon wafer (manufactured by Shin-Etsu Semiconductor Co., Ltd.) was immersed at 25° C. for 30 minuets, and then dried by a spin dryer to prepare a substrate contaminated by a metal.

The metal contamination of the substrate was quantitatively determined by a total reflection fluorescent X-ray method using "TREX610T" manufactured by Technos Co., Ltd., and as a result, a copper atom adhered in an amount of $2 \times 10^{13}$ atom/cm$^2$.

Example 1

(1) Chemical Mechanical Polishing and Cleaning of Insulating Film (1-1) Chemical Mechanical Polishing An insulating film surface of the substrate with an insulating film of a low-dielectric constant, said substrate being prepared in the above process (C), was subjected to chemical mechanical polishing under the following conditions using a chemical mechanical polishing apparatus "EPO112" (manufactured by Ebara Corp.).

(Polishing Conditions)

Chemical mechanical polishing aqueous dispersion: polishing aqueous dispersion (1)
Polishing pad: IC1000/SUBA400, available from Rodel Nitta Company
Head rotating speed: 70 rpm
Head load: 250 g/cm$^2$
Turn table rotating speed: 70 rpm
Feed rate of polishing aqueous dispersion: 300 ml/min
Polishing time: 60 seconds (1-2) Cleaning of Insulating Film Subsequently to the chemical mechanical polishing of the above step (1-1), the surface of the substrate obtained after the polishing was subjected to on-table cleaning and then brush-scrub cleaning under the following conditions. This is referred to as "two-stage cleaning" hereinafter.

(On-Table Cleaning)
Cleaning agent: cleaning composition (1)
Head rotating speed: 70 rpm
Head load: 100 g/cm$^2$
Turn table rotating speed: 70 rpm
Feed rate of cleaning agent: 300 ml/min
Cleaning time: 30 seconds (Brush-Scrub Cleaning)
Cleaning agent: cleaning composition (11)
Upper brush rotating speed: 100 rpm
Lower brush rotating speed: 100 rpm
Substrate rotating speed: 100 rpm
Feed rate of cleaning agent: 300 ml/min
Cleaning time: 60 seconds (1-3) Evaluation of Removal Rate and Surface Defect As for the substrate before the chemical mechanical polishing and the substrate after the cleaning, the film thickness of the insulating film was measured by the use of an optical interferotype measuring instrument "FPT500" (manufactured by SENTEC Co.), and from a difference between the resulting values and the polishing time, a removal rate was calculated. As a result, the removal rate was 1,200 Å/min.

Further, after the cleaning, the whole surface of the insulating film was observed by the use of a wafer surface inspection system "Surfscan SP1" (manufactured by KLA Tencor Co.), and as a result, the number of surface defects was 8 defects/surface. The "surface defects" used herein include residual abrasives, water mark (nearly circular tarnished portion like a stain though the cause of occurrence is unknown), and the like.

(2) Cleaning of Metal-Contaminated Substrate

The substrate contaminated by a metal, said substrate being prepared in the above process (D), was subjected to two-stage cleaning in the same manner as in the above step "(1-2) Cleaning of insulating film" by the use of a chemical mechanical polishing apparatus "EPO112" (manufactured by Ebara Corp.).

After the cleaning, the metal contamination of the substrate was quantitatively determined by a total reflection fluorescent X-ray method using "TREX610T" manufactured by Technos Co., Ltd., and as a result, the amount of the residual copper atom was $5 \times 10^{11}$ atom/cm².

Examples 2-13 and Comparative Examples 1-7

(1) Cleaning of Insulating Film After Chemical Mechanical Polishing (1-1) Chemical Mechanical Polishing An insulating film surface of the substrate with an insulating film of a low-dielectric constant, said substrate being prepared in the process (C), was subjected to chemical mechanical polishing in the same manner as in Example 1, except that the chemical mechanical polishing aqueous dispersion shown in Table 4 was used instead of the chemical mechanical polishing aqueous dispersion (1).

(1-2) Cleaning of Insulating Film

Subsequently to the chemical mechanical polishing of the above step (1-1), the surface of the substrate obtained after the polishing was subjected to two-stage cleaning in the same manner as in Example 1, except that the cleaning agents shown in Table 4 were used instead of the cleaning compositions (1) and (11).

(1-3) Evaluation of Removal Rate and Surface Defect

The removal rate of the insulating film and the number of surface defects after cleaning were evaluated in the same manner as in Example 1. The results are set forth in Table 4.

(2) Cleaning of Metal-Contaminated Substrate

The substrate contaminated by a metal, said substrate being prepared in the process (D), was subjected to two-step cleaning in the same manner as in Example 1, except that the cleaning agents shown in Table 4 were used instead of the cleaning compositions (1) and (11).

TABLE 4

| | chemical mechanical polishing aqueous dispersion | cleaning composition | |
|---|---|---|---|
| | | for on-table cleaning | for brush-scrub cleaning |
| Ex. 1 | aqueous dispersion (1) | composition (1) | composition (11) |
| Ex. 2 | aqueous dispersion (2) | composition (4) | composition (11) |
| Ex. 3 | aqueous dispersion (3) | ultra-pure water | composition (5) |
| Ex. 4 | aqueous dispersion (4) | ultra-pure water | composition (7) |
| Ex. 5 | aqueous dispersion (5) | composition (9) | composition (9) |
| Ex. 6 | aqueous dispersion (6) | ultra-pure water | composition (10) |
| Ex. 7 | aqueous dispersion (7) | composition (2) | composition (11) |
| Ex. 8 | aqueous dispersion (8) | composition (3) | composition (11) |
| Ex. 9 | aqueous dispersion (8) | composition (4) | composition (11) |
| Ex. 10 | aqueous dispersion (8) | composition (5) | composition (5) |
| Ex. 11 | aqueous dispersion (9) | composition (6) | composition (6) |
| Ex. 12 | aqueous dispersion (9) | composition (7) | composition (7) |
| Ex. 13 | aqueous dispersion (10) | composition (10) | composition (10) |
| Comp. Ex. 1 | aqueous dispersion (1) | composition (11) | composition (11) |
| Comp. Ex. 2 | aqueous dispersion (4) | ultra-pure water | composition (11) |
| Comp. Ex. 3 | aqueous dispersion (7) | ultra-pure water | composition (11) |
| Comp. Ex. 4 | aqueous dispersion (8) | composition (11) | composition (11) |
| Comp. Ex. 5 | aqueous dispersion (10) | ultra-pure water | composition (11) |
| Comp. Ex. 6 | aqueous dispersion (9) | ultra-pure water | composition (11) |
| Comp. Ex. 7 | aqueous dispersion (1) | composition (12) | composition (11) |

| | polishing and cleaning of insulting film | | cleaning of metal-contaminated substrate |
|---|---|---|---|
| | polishing rate of insulating film (Å/min) | number of surface defects after cleaning (defects/surface) | residual copper concentration (atom/cm²) |
| Ex. 1 | 1,200 | 8 | $5 \times 10^{11}$ |
| Ex. 2 | 1,250 | 15 | $8 \times 10^{10}$ |
| Ex. 3 | 1,150 | 18 | $4 \times 10^{11}$ |
| Ex. 4 | 420 | 32 | $2 \times 10^{11}$ |
| Ex. 5 | 40 | 7 | $3 \times 10^{11}$ |
| Ex. 6 | 1,020 | 9 | $1 \times 10^{11}$ |
| Ex. 7 | 1,050 | 6 | $7 \times 10^{11}$ |
| Ex. 8 | 1,080 | 9 | $8 \times 10^{10}$ |
| Ex. 9 | 1,080 | 8 | $6 \times 10^{11}$ |
| Ex. 10 | 1,080 | 12 | $6 \times 10^{10}$ |
| Ex. 11 | 240 | 9 | $3 \times 10^{11}$ |
| Ex. 12 | 240 | 12 | $6 \times 10^{10}$ |
| Ex. 13 | 1,020 | 7 | $3 \times 10^{11}$ |
| Comp. Ex. 1 | 1,200 | 84 | $7 \times 10^{10}$ |
| Comp. Ex. 2 | 420 | 320 | $3 \times 10^{11}$ |
| Comp. Ex. 3 | 1,050 | 264 | $2 \times 10^{13}$ |
| Comp. Ex. 4 | 1,080 | 187 | $8 \times 10^{12}$ |
| Comp. Ex. 5 | 1,020 | 251 | $3 \times 10^{10}$ |
| Comp. Ex. 6 | 240 | 150 | $3 \times 10^{12}$ |
| Comp. Ex. 7 | 1,150 | 420 | $6 \times 10^{10}$ |

Example 14

(1) Chemical Mechanical Polishing and Cleaning of Substrate with Pattern (1-1) Chemical Mechanical Polishing A substrate with a copper wiring pattern (available from International SEMATECH, Model Number: 854LKD003) was subjected to two-stage chemical mechanical polishing under the following conditions using a chemical mechanical polishing apparatus "EPO112" (manufactured by Ebara Corp.).

(First Stage of Chemical Mechanical Polishing)

Chemical mechanical polishing aqueous dispersion: polishing aqueous dispersion (5)

Polishing pad: IC1000/SUBA400, available from Rodel Nitta Company

Turn table rotating speed: 70 rpm
Head rotating speed: 70 rpm
Head load: 250 g/cm²
Feed rate of polishing aqueous dispersion: 300 ml/min
Polishing time: 150 seconds (Second Stage of Chemical Mechanical Polishing)

Chemical mechanical polishing aqueous dispersion: polishing aqueous dispersion (9)

Turn table rotating speed: 70 rpm
Head rotating speed: 70 rpm
Head load: 250 g/cm$^2$
Feed rate of polishing aqueous dispersion: 300 ml/min
Polishing time: 45 seconds (1-2) Cleaning Subsequently to the chemical mechanical polishing of the above step (1-1), the surface of the substrate obtained after the polishing was subjected to on-table cleaning and then brush-scrub cleaning under the following conditions.

(On-Table Cleaning)
Cleaning agent: cleaning composition (7)
Head rotating speed: 70 rpm
Head load: 100 g/cm$^2$
Turn table rotating speed: 70 rpm
Cleaning agent feed rate: 300 ml/min
Cleaning time: 30 seconds (Brush-Scrub Cleaning)
Cleaning agent: cleaning composition (7)
Upper brush rotating speed: 100 rpm
Lower brush rotating speed: 100 rpm
Substrate rotating speed: 100 rpm
Feed rate of cleaning agent: 300 ml/min
Cleaning time: 60 seconds (1-3) Evaluation of Removal Rate and Surface Defect After the cleaning, the whole surface of the substrate was observed by the use of a wafer surface inspection system "Surfscan SP1" (manufactured by KLA Tencor Co.), and as a result, the number of surface defects was 8 defects/surface. Further, dishing of the wiring portion of 100 μm wide on the substrate was measured by the use of a High Resolution Profiler "HRP240" (manufactured by KLA Tencor Co.), and as a result, it was 310 Å.

Comparative Example 8

A substrate with a copper wiring pattern (854LKD003) was subjected to two-stage chemical mechanical polishing and then subjected to two-stage cleaning in the same manner as in Example 14, except that ultra-pure water was used as a cleaning agent for on-table cleaning and the cleaning composition (11) was used as a cleaning agent for brush-scrub cleaning. After the cleaning, the whole surface of the substrate was observed in the same manner as in Example 14, and as a result, the number of surface defects was 162 defects/surface. Further, dishing of the wiring portion of 100 μm wide on the substrate was 310 Å.

It can be seen from the results of Examples 1 to 13 and Comparative Examples 1 to 7 that in case of cleaning using only the conventional cleaning agents (Comparative Examples 1 to 7), a great number of surface defects occurred though the ability to remove impure metal ions from the substrate was good, but on the other hand, in case of cleaning using the cleaning compositions of the invention (Examples 1 to 13), the ability of the conventional cleaning agent to remove impure metal ions could be maintained or improved and occurrence of surface defects could be suppressed.

It can be seen from comparison between Example 14 and Comparative Example 8 that when the substrate with a pattern was cleaned by the use of only the conventional cleaning agent after the chemical mechanical polishing, a great number of surface defects were observed, but on the other hand, when the substrate was cleaned by the use of the cleaning composition of the invention, occurrence of surface defects could be suppressed without exerting evil influences on the metal wiring portion.

What is claimed is:

1. A cleaning composition comprising organic polymer particles (A) having a crosslinked structure and a surfactant (B), an organic acid (C), a complexing agent (D), a solvent (E), and a pH adjuster,
    wherein the content of the particle (A) ranges from 0.001% to 0.05% by mass, based on the mass of the cleaning composition,
    wherein the cleaning composition does not contain an oxidizing agent, and
    wherein the cleaning composition cleans the surface of a semiconductor comprising metal wiring without corroding the metal wiring.

2. The cleaning composition as claimed in claim 1, wherein the organic polymer particles (A) having a crosslinked structure have at least one functional group selected from the group consisting of a carboxyl group, a hydroxyl group, an amino group, a sulfonic acid group and —N$^{30}$ R$_3$, wherein R is a hydrogen atom or an alkyl group of 1 to 4 carbon atoms.

3. The cleaning composition as claimed in claim 1, wherein the organic polymer particles (A) having a crosslinked structure have an average dispersed particle diameter of 120 to 500 nm.

4. The cleaning composition as claimed in claim 1, wherein the organic polymer particles (A) having a crosslinked structure are particles comprising a copolymer of an unsaturated monomer (a1) containing a carboxyl group, a polyfunctional monomer (a2) and an unsaturated monomer (a3) other than the monomers (a1) and (a2).

5. A cleaning composition comprising organic polymer particles (A) having a crosslinked structure, a surfactant (B), an organic acid (C), a complexing agent (D), a solvent (E), and a pH adjuster, wherein the content of the particles (A) ranges from 0.001% to 0.05% by mass, based on the composition,
    wherein the cleaning composition cleans the surface of a semiconductor comprising metal wiring without corroding the metal wiring.

6. The cleaning composition of claim 5, wherein the organic polymer particles (A) having a crosslinked structure have at least one functional group selected from the group consisting of a carboxyl group, a hydroxyl group, an amino group, a sulfonic acid group and —N+R$_3$, wherein R is a hydrogen atom or an alkyl group of 1 to 4 carbon atoms.

7. The cleaning composition as claimed in claim 5, wherein the organic polymer particles (A) having a crosslinked structure have an average dispersed particle diameter of 120 to 500 nm.

8. The cleaning composition as claimed in claim 5, wherein the organic polymer particles (A) having a crosslinked structure are particles comprising a copolymer of an unsaturated monomer (a1) containing a carboxyl group, a poyfunctional monomer (a2) and an unsaturated monomer (a3) other than the monomers (a1) and (a2).

9. A cleaning composition consisting essentially of organic polymer particles (A) having a crosslinked structure, a surfactant (B), an organic acid (C), a complexing agent (D), a solvent (E), and a pH adjuster, wherein the content of the particles (A) ranges from 0.001% to 0.05% by mass, based on the composition.

10. The cleaning composition as claimed in claim 9, wherein the organic polymer particles (A) having a crosslinked structure have at least one functional group selected from the group consisting of a carboxyl group, a hydroxyl group, an amino group, a sulfonic acid group and —N+R$_3$, wherein R is a hydrogen atom or an alkyl group of 1 to 4 carbon atoms.

11. The cleaning composition as claimed in claim 9, wherein the organic polymer particles (A) having a crosslinked structure have an average dispersed particle diameter of 120 to 500 nm.

12. The cleaning composition as claimed in claim 9, wherein the organic polymer particles (A) having a crosslinked structure are particles comprising a copolymer of an unsaturated monomer (a1) containing a carboxyl group, a polyfunctional monomer (a2) and an unsaturated monomer (a3) other than the monomers (a1) and (a2).

13. A cleaning composition consisting of organic polymer particles (A) having a crosslinked structure, a surfactant (B), an organic acid (C), a complexing agent (D), a solvent (E), and a pH adjuster, wherein the content of the particles (A) ranges from 0.001% to 0.05% by mass, based on the composition.

14. The cleaning composition as claimed in claim 13, wherein the organic polymer particles (A) having a crosslinked structure have at least one functional group selected from the group consisting of a carboxyl group, a hydroxyl group, an amino group, a sulfonic acid group and —N+R$_3$, wherein R is a hydrogen atom or an alkyl group of 1 to 4 carbon atoms.

15. The cleaning composition as claimed in claim 13, wherein the organic polymer particles (A) having a crosslinked structure have an average dispersed particle diameter of 120 to 500 nm.

16. The cleaning composition as claimed in claim 13, wherein the organic polymer particles (A) having a crosslinked structure are particles comprising a copolymer of an unsaturated monomer (a1) containing a carboxyl group, a polyfunctional monomer (a2) and an unsaturated monomer (a3) other than the monomers (a1) and (a2).

* * * * *